United States Patent [19]
Maeda

[11] Patent Number: 5,862,162
[45] Date of Patent: Jan. 19, 1999

[54] EXTERNAL RESONATOR TYPE WAVELENGTH- TUNABLE LIGHT SOURCE

[75] Inventor: Minoru Maeda, Tokyo, Japan

[73] Assignee: Ando Electric Co., Ltd., Tokyo, Japan

[21] Appl. No.: 825,713

[22] Filed: Mar. 19, 1997

[30] Foreign Application Priority Data

Mar. 25, 1996 [JP] Japan ..................................... 8-094927

[51] Int. Cl.$^6$ .................................................. H01S 3/10
[52] U.S. Cl. ................................ 372/20; 372/32; 372/98; 372/100; 372/102; 372/6; 372/92
[58] Field of Search ................................ 372/20, 97, 32, 372/98, 100, 102, 99, 6, 92

[56] References Cited

U.S. PATENT DOCUMENTS

| | | | |
|---|---|---|---|
| 5,491,714 | 2/1996 | Kitamura | 372/32 |
| 5,493,575 | 2/1996 | Kitamura | 372/20 |
| 5,548,609 | 8/1996 | Kitamura | 372/92 |

FOREIGN PATENT DOCUMENTS 6-112583  4/1994  Japan .

Primary Examiner—Leon Scott, Jr.

Attorney, Agent, or Firm—Finnegan, Henderson, Farabow, Garrett & Dunner, L.L.P.

[57] ABSTRACT

A wavelength-tunable light source is provided, by which an output beam of a stable wavelength can be obtained even if a driving condition of the optical amplifier is changed, and in which stable wavelength tuning without mode hopping can be performed. The light source comprises: an optical amplifier, both end faces thereof being antireflection-processed, for generating a natural emission beam from one end face of the amplifier, and for amplifying a beam input into the one end face and outputting the amplified beam from the other end face of the amplifier; an optical amplifier drive circuit for driving the optical amplifier; an optical resonance reflector for resonating the natural emission beam output from the optical amplifier at an optical resonance wavelength, and reflecting the resonated beam to the one end face of the optical amplifier; a wavelength controller for controlling the optical resonance wavelength of the optical resonance reflector; a resonance length controller for controlling a resonance length of the optical resonance reflector; and a beam outputter for extracting a beam, which was reflected by the optical resonance reflector, amplified by the optical amplifier, and output from the other end face of the optical amplifier, and outputting the extracted beam.

9 Claims, 7 Drawing Sheets

EXTERNAL RESONATOR TYPE WAVELENGTH- TUNABLE LIGHT SOURCE

BACKGROUND OF THE INVENTION

1. Field of the Invention

The present invention relates to an external resonator type wavelength-tunable light source used, for example, in the optical measurement field. This application is based on Japanese patent application No. Hei 8-94927 filed in Japan, the content of which is incorporated herein by reference.

2. Description of the Related Art

The structure of a conventional external resonator type wavelength-tunable semiconductor laser (LD) light source is shown in FIG. 5. In the figure, LD 11 as an optical amplifier has a Fabry-Pérot type structure, one end face of which being coated with an antireflection film (i.e., AR coating) 11, and is driven by LD drive circuit 12. The outgoing beam from the antireflection-film side of LD 11 is transformed into a collimated beam by lens 13, and is input into diffraction grating 14. The diffraction grating 14 is used as a wavelength-selection reflector, and has a function to reflect a beam (portion) having a specified wavelength determined according to the incident angle, selected from among the incident collimated beam, in a specified direction.

That is, the diffraction grating 14 and the other end face without an antireflection film of LD 11 form a resonator; thus, it is possible to perform LD oscillation by re-inputting the selected beam (by diffraction grating 14) into LD 11.

On the other hand, The laser beam output from the side without antireflection film 111 of LD 11 is transformed into a collimated beam by lens 15; passes through optical isolator 16; is converged by lens 17; and is then input as an output beam into output fiber 18 for transmission. Here, optical isolator 16 has a function of preventing the beam reflected from the output fiber 18 side from returning to LD 11 which is an optical amplifier.

The direction of diffraction grating 14 can be adjusted for any angle with respect to the incident optical axis by using angle adjustment mechanism 19. Therefore, by performing a driving control using wavelength-tunable drive circuit 20 for the angle adjustment mechanism 19, diffraction grating 14 can be rotated to be set in any direction, and thus it is possible to arbitrarily change the selected wavelength (i.e., Bragg's wavelength) and thereby to perform wavelength variation within the gain range of LD 11.

In addition, it is possible to move diffraction grating 14 in a parallel direction with respect to the incident optical axis by using parallel motion mechanism 21. Accordingly, diffraction grating 14 can be moved in parallel with the direction of the optical axis of the resonator by performing a driving control using positioning drive circuit 22 with respect to parallel motion mechanism 21, and thus the resonance wavelength can be arbitrarily changed.

In this way, in the wavelength-tunable LD light source having the above-explained structure, it is possible to simultaneously perform continuous wavelength-variation without mode hopping by controlling the Bragg's wavelength variation according to angle adjustment and the resonance wavelength variation according to positioning adjustment with respect to diffraction grating 14.

Another structure of the external resonator type wavelength-tunable LD light source for also realizing a narrow spectral line width has been disclosed in Japanese Patent Application, First Publication, No. Hei 6-112583. In FIG. 6, parts which are identical to those shown in FIG. 5 are given identical reference numbers, and duplicate explanations will be omitted here.

In this external resonator type wavelength-tunable light source, LD 11 with an antireflection film on one end face is also used as an optical amplifier. On the other hand, as an external resonator, (i) beam splitter 23 for splitting a beam from LD 11 and diffraction grating 14 and (ii) total reflection mirror 24 for totally reflecting the split beam from the beam splitter 23 in the incident direction are used with above-explained diffraction grating 14; angle adjustment mechanism 19; and parallel motion mechanism 21, to form optical resonance reflector A. This optical resonance reflector A is used as a reflector at the antireflection-film 111 side of LD 11.

This external resonator construction by using the optical resonance reflector A has a steep reflection characteristic with respect to the wavelength; thus, the oscillation wavelength of LD 11 is subjected to optical negative feedback. Therefore, spectral line width can be narrowed. The continuous wavelength variation can also be obtained by using, in principle, the same construction of the wavelength-tunable LD light source with the diffraction grating (as shown in FIG. 5), and by performing the angle adjustment of diffraction grating 14 and the length adjustment of the resonator, simultaneously.

However, in this structure of the wavelength-tunable LD light source of the optical resonance reflector type, there exist two resonators: one is a resonator consisting of total reflection mirror 24 and diffraction grating 14, and the other is a resonator consisting of diffraction grating 14 and the end face without an antireflection film (111) of LD 11. LD 11 is inserted in one resonator; therefore, the refractive index of LD 11 affects the length of the resonator, by which the states of variations of both resonators are not the same at the time of wavelength variation.

In the structures of the conventional wavelength-tunable LD light sources as shown in FIGS. 5 and 6, LD oscillation can be realized by equipping LD 11, that is, an optical amplifier, in the resonator. However, LD 11 has a problem in which the refractive index thereof changes according to operating conditions such as current, temperature, the oscillation wavelength, and the like, and thus stability of the oscillation wavelength is inferior. In order to obtain a stable oscillation wavelength, it is necessary to consider driving current, temperature, etc., with respect to LD 11, in addition to maintaining a fixed length of the external resonator.

Furthermore, as for LD light sources, another method for performing light-intensity modulation with respect to the output beam has been proposed. In this case, if LD driving current is directly modulated, the refractive index of the LD is changed. Consequently, in addition to the intensity modulation of the output beam, the oscillation wavelength is also modulated. Therefore, when the light-intensity modulation with a stable oscillation wavelength is required, it is necessary to connect an external optical modulator to the system, instead of performing direct modulation of the LD driving current.

On the other hand, in the case of performing continuous wavelength variation without mode hopping, it is necessary to coordinate the changes of (i) Bragg's wavelength ($\lambda_{Gr}$) determined by diffraction grating 14 and (ii) resonance wavelength ($\lambda_{FP}$) determined according to the m-order of the longitudinal mode of the resonator, so as to obtain the same amounts of both wavelength changes. In order to satisfy this condition, the angle adjustment of diffraction grating 14 and the length adjustment of the resonator must be performed while maintaining the wavelength difference between the Bragg's wavelength and the resonance wavelength as $\lambda/2$ or less.

As a method for realizing this specific condition, a sine bar mechanism, which is used in spectroscopes, has been proposed. FIG. 7 shows a system arrangement using the sine bar mechanism. In FIG. 7, parts which are identical to those shown in FIG. 5 or 6 are given identical reference numbers.

Diffraction grating 14 is driven and rotated by an angle adjustment mechanism (not shown) which is adjustable with respect to the angle and thus has a function to change the Bragg's wavelength. In addition, the angle adjustment mechanism itself is disposed on the parallel motion mechanism and hence can be moved in parallel in the direction of the axis of the resonator, by which a function to change the resonance wavelength is provided.

The diffraction grating 14 is rotated via a sine bar contacted with a contact stand (detailed indication omitted in Figures). When the parallel motion mechanism is shifted in parallel according to a driving control by the positioning drive circuit, diffraction grating 14 is also automatically rotated via the sine bar.

In the structure of the sine bar, the relationship between the lengths of the resonator and the sine bar must satisfy the following equations (1)–(3).

$$\lambda_{Gr} = 2 \cdot d \cdot \sin\theta \quad (1)$$

$$\lambda_{FP} = 2 \cdot n \cdot L/m = 2 \cdot L_A \cdot \sin\theta/m \quad (2)$$

$$\Delta\lambda = \lambda_{Gr} - \lambda_{FP} = 2 \cdot \sin\theta \cdot (d - L_A/m) \quad (3)$$

Here, $\lambda_{Gr}$ is the Bragg's wavelength selected by diffraction grating 14, d indicates the spacing between grooves of diffraction grating 14, $\lambda_{FP}$ is the resonance wavelength determined by the external resonator, n indicates the refractive index inside the external resonator, L indicates the length of the external resonator, m indicates the order of the resonance longitudinal mode of the external resonator, $L_A$ indicates the arm length of the sine bar, $\theta$ means the incident angle of the beam input into diffraction grating 14, and $\Delta\lambda$ indicates the difference between the Bragg's wavelength $\lambda_{Gr}$ and the resonance wavelength $\lambda_{FP}$.

When the parallel motion is performed while satisfying the above conditions, the resonance-wavelength variation using the sine bar structure and the Bragg's wavelength variation using diffraction grating 14 have the same amount with respect to the wavelength change; thus, it is possible to continuously vary the wavelength. Even though the sine bar mechanism is not used, such continuous wavelength variation is possible if the incident angle (on diffraction grating 14) and the length of the resonator are controlled so as to satisfy the above-explained equations. However, it is very difficult to separately and continuously control the adjustments of the incident angle and the length of the resonator over a wide range.

In addition, the refractive index of LD 11 changes according to the driving current, temperature, and the oscillation wavelength, as described above. The variations of the refractive index due to the driving current and temperature become approximately linear, while the variation of the refractive index due to the oscillation wavelength becomes non-linear. Therefore, even if the linear variations of the physical length of the resonator and the Bragg's wavelength of diffraction grating 14 are correctly performed, the actual change of the optical length of the resonator becomes non-linear. Accordingly, if the actual wavelength variation width is greater than a certain wavelength range, the difference between the resonance wavelength and the Bragg's wavelength becomes $\lambda/2$ or more. In this case, the wavelength variation is accompanied with mode hopping.

It is also possible to perform the continuous wavelength variation if a non-linear variation with respect to the length adjustment of the resonator, corresponding to the wavelength variation, is performed instead of performing the linear variation. However, non-linear characteristics of the refractive index for the wavelength are different according to different driving currents of LD 11; thus, it is also very difficult to perform the wavelength variation with non-linear adjustment of the length of the resonator.

In the conventional diffraction grating type wavelength-tunable LD light source as shown in FIG. 5, a variation can be proposed in which a semiconductor optical amplifier with both end faces processed so as to have antireflection coatings is disposed instead of LD 11. In this case, wavelengths of beams reflected by diffraction grating 14 have a center wavelength corresponding to the Bragg's wavelength according to multiple interference; thus, phase matching is achieved to a certain degree.

However, phase matching in the case of the multiple interference is inferior in comparison with the phase conditions in the resonance characteristics. Therefore, even though the beam reflected from diffraction grating 14 is incident on the optical amplifier and is amplified while passing through the amplifier, it is impossible to obtain a beam having a narrow spectral line width and high light intensity such as the beam obtained at the LD oscillation.

In the conventional light-source structure in which the LD as an optical amplifier is provided in the resonator, there is a problem in that the refractive index characteristics are changed according to variations of the driving current, temperature, the oscillation wavelength, etc., of the LD, and thus the effective optical length as the length of the resonator is also changed, as described above.

In particular, the variation of the refractive index with respect to the oscillation wavelength is non-linear; thus, a continuous wavelength variation over a wide band cannot be obtained even though a linear variation of the length of the resonator is performed. Additionally, when the wavelength variation is performed with a different driving current, there occurs a problem in which the characteristics of the continuous wavelength variation are changed in a manner such that mode hopping occurs at a different wavelength.

Furthermore, if the LD driving current is directly modulated for modulating the light intensity of the output light, the refractive index of the LD is changed; thus, the oscillation wavelength is also modulated in addition to the light-intensity modulation of the optical output. Therefore, if the light-intensity modulation with a stable oscillation wavelength is required, it is necessary to connect an external optical modulator instead of the direct modulation of the LD driving current. In this case, there is a problem in that the cost of the light source is increased.

SUMMARY OF THE INVENTION

It is an object of the present invention to provide an external resonator type wavelength-tunable light source by which desirable wavelength stability can be obtained at a narrow spectral line width even though the refractive index is changed according to a variation of operating conditions of the optical amplifier, and stable characteristics for the continuous wavelength variation can be obtained at the time of the wavelength variation.

Therefore, the present invention provides an external resonator type wavelength-tunable light source comprising:

an optical amplifier, both end faces thereof being antireflection-processed, for generating a natural emission beam from one end face of the amplifier, and for amplifying a beam input into the one end face and outputting the amplified beam from the other end face of the amplifier; an optical amplifier drive circuit for driving the optical amplifier; an optical resonance reflector for resonating the natural emission beam output from the optical amplifier at an optical resonance wavelength, and reflecting the resonated beam to the one end face of the optical amplifier; wavelength control means for controlling the optical resonance wavelength of the optical resonance reflector; resonance length control means for controlling a resonance length of the optical resonance reflector; and beam output means for extracting a beam, which was reflected by the optical resonance reflector; amplified by the optical amplifier; and output from the other end face of the optical amplifier, and outputting the extracted beam.

The optical resonance reflector may comprise: a diffraction grating for reflecting a beam in parallel with the optical axis of an incident beam on the diffraction grating, the wavelength of the reflected beam differing in accordance with the incident angle of the incident beam; a total reflection mirror for reflecting an incident beam on the mirror in parallel with the optical axis of the incident beam; and a beam splitter for reflecting the natural emission beam from the optical amplifier to the diffraction grating; transmitting and introducing one portion of a beam reflected by the diffraction grating to the total reflection mirror so as to make the beam resonate between the diffraction grating and the total reflection mirror, and simultaneously reflecting the remaining portion of the beam reflected by the diffraction grating to the optical amplifier.

In this optical resonance reflector, the following variation is also possible, in which: the beam splitter transmits the natural emission beam from the optical amplifier to the diffraction grating; reflects one portion of a beam reflected by the diffraction grating to the total reflection mirror so as to make the beam resonate between the diffraction grating and the total reflection mirror, and simultaneously transmits the remaining portion of the beam reflected by the diffraction grating to the optical amplifier.

As another variation, the optical resonance reflector may comprise: first and second total reflection mirrors, facing each other, for reflecting an incident beam in parallel with the incident optical axis, respectively; a beam splitter for reflecting and introducing the natural emission beam from the optical amplifier to the first total reflection mirror; transmitting and introducing one portion of a beam reflected by the first total reflection mirror to the second total reflection mirror so as to make the beam resonate between the first and second total reflection mirrors, and simultaneously reflecting the remaining portion of the beam reflected by the first total reflection mirror to the optical amplifier; and an optical bandpass filter, inserted into an optical path between one of the first and second total reflection mirrors and the beam splitter, for transmitting a beam of a wavelength which is different in accordance with the angle of the filter with respect to the axis of the optical path.

When using the wavelength-tunable light source including such an optical resonance reflector, the wavelength control means adjusts the angle of (i) the diffraction grating or (ii) the optical bandpass filter with respect to the incident optical axis; and the resonance length control means makes (i) at least one of the diffraction grating and the total reflection mirror, or (ii) at least one of the total reflection mirrors, move along and in parallel with the resonance optical axis.

According to this invention, it is possible to provide a wavelength-tunable light source by which an output beam of a stable wavelength can be obtained even if a driving condition of the optical amplifier is changed, and in which stable wavelength tuning without mode hopping can be performed.

DESCRIPTION OF THE PREFERRED EMBODIMENTS

Hereinbelow, embodiments according to the present invention will be explained in detail with reference to FIGS. 1–4.

First Embodiment

Figure 1:
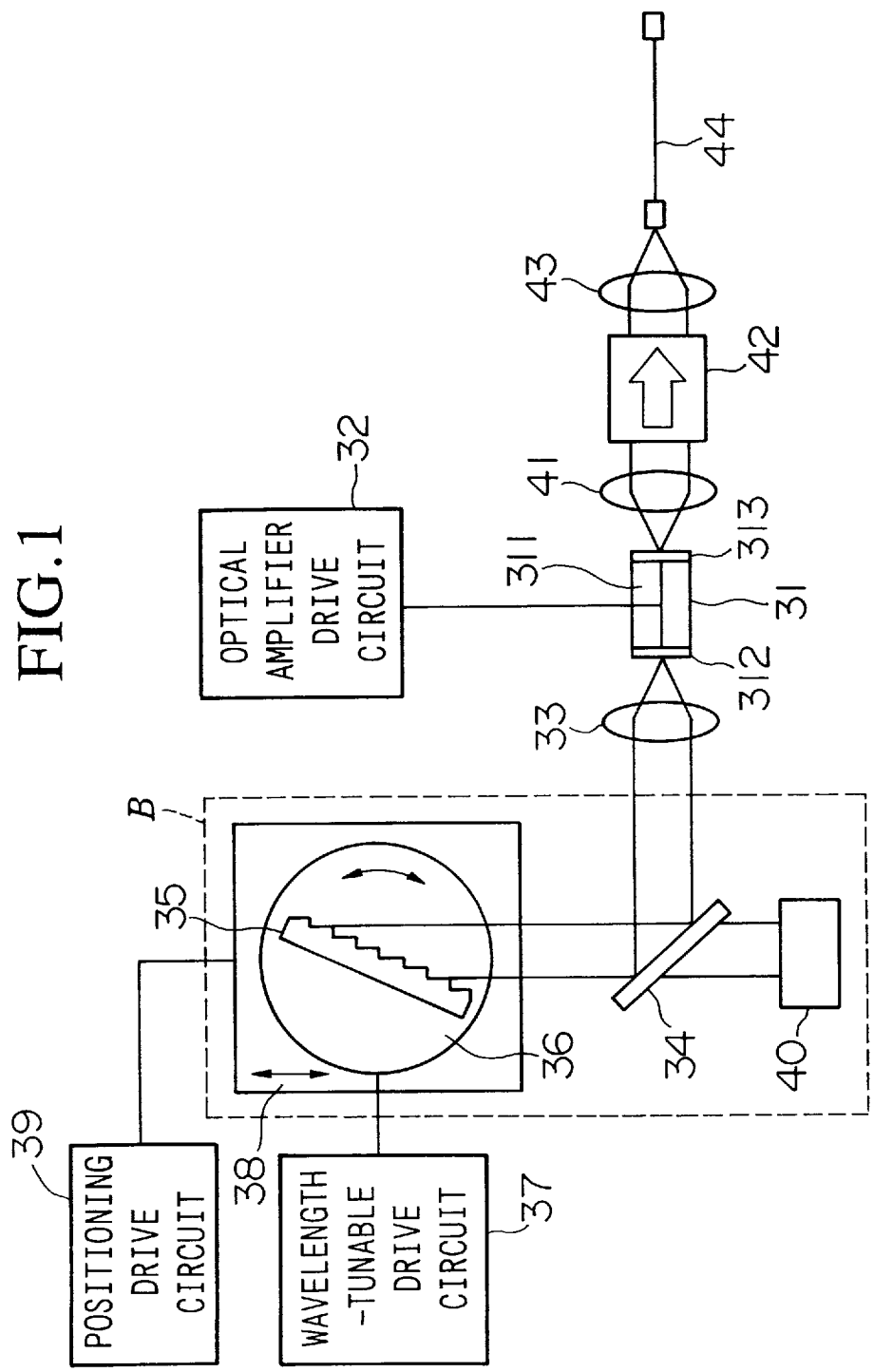
FIG. 1 is a block diagram showing the structure of the external resonator type wavelength-tunable light source of the first embodiment according to the present invention.

FIG. 1 is a diagram showing the structure of the external resonator type wavelength-tunable light source of the first embodiment according to the present invention.

In FIG. 1, semiconductor optical amplifying element 311 is used as optical amplifier 31. This semiconductor optical amplifying element 311 has a double heterostructure as LDs, and both end faces of the element are antireflection-processed by making them with antireflection films 312 and 313 (that is, AR coating), so as to prevent occurrence of LD oscillation. As for the processing for both end faces of the semiconductor optical amplifying element 311, another structure in which windows are provided in the end faces, or in which an optical waveguide is formed in an oblique direction with respect to the end faces, may be used instead of the AR coating structure.

The semiconductor optical amplifying element 311 is connected to optical amplifier drive circuit 32, and emits, according to current injected from this drive circuit 32, natural emission beams with random phases in a wavelength range in which amplification gain can be obtained, from both end faces.

Lens 33 is provided on the optical axis of one of the outgoing beams from the optical amplifier 31, and transforms the natural emission beam output from an end face of the optical amplifier 31 into a collimated beam. The natural emission beam, which was transformed into a collimated beam, is then incident on beam splitter 34.

In the characteristics relating to beam splitter 34, reflectance is 20% and transmittance is 80%. Therefore, 20% of input collimated beam is reflected from beam splitter 34 to diffraction grating 35. This diffraction grating 35 functions as a wavelength-selection reflector, and reflects only a beam portion, which has a wavelength determined according to incident angle θ (that is, the Bragg's wavelength) from among the collimated beam (portions) input at incident angle θ, in a direction of the optical axis from beam splitter 34. Other beam portions having wavelengths other than the Bragg's wavelength are reflected in directions other than the optical axis from beam splitter 34, and thus never return to optical amplifier 31.

The diffraction grating 35 is adjustable to any angle with respect to the incident optical axis by using angle adjustment mechanism 36. Therefore, by performing a driving control of this angle adjustment mechanism 36 by wavelength-tunable drive circuit 37, diffraction grating 35 can be rotated to be set at any angle so as to arbitrarily change the selected wavelength (i.e., the Bragg's wavelength). In this way, wavelength variation can be realized within a gain range of the optical amplifier 31.

In addition, diffraction grating 35 can be moved in parallel with the incident optical axis by using parallel motion mechanism 38. That is, by performing a driving control of this parallel motion mechanism 38 by using positioning drive circuit 39, diffraction grating 35 can be moved in parallel with the optical axis of the resonator, whereby the resonance wavelength can be arbitrarily changed.

According to the above explanations, it is possible to perform continuous wavelength tuning without mode hopping by controlling the change of the Bragg's wavelength by adjusting the angle of diffraction grating 35 and the change of the resonance wavelength by the positioning adjustment, simultaneously.

The reflected beam of the Bragg's wavelength, which was selected by diffraction grating 35, is again incident on beam splitter 34. 20% of the incident beam is reflected to optical amplifier 31, while the remaining 80% of the beam is transmitted through beam splitter 34 and is further incident on total reflection mirror 40. This total reflection mirror 40 totally reflects the incident beam and makes it incident on beam splitter 34 again.

In the figure, optical resonance reflector B consists of beam splitter 34, diffraction grating 35, angle adjustment mechanism 36, parallel motion mechanism 38, and total reflection mirror 40.

Here, the beam output from the other end face of optical amplifier 31 is transformed into a collimated beam by lens 41. This collimated beam is transmitted through optical isolator 42, converged by lens 43, and is incident on output fiber 44 as an output beam. The optical isolator 42 prevents the reflected beam from the output fiber 44 side from returning to optical amplifier 31.

The operations of the external resonator type wavelength-tunable light source having the above-explained structure will be explained below.

First, reflection and transmission are repeated between the diffraction grating 35, the beam splitter 34, and the total reflection mirror 40. At the repetition, only the beam (portion) with the wavelength selected by diffraction grating 35, which also agrees with the resonance wavelength, resonates between diffraction grating 34 and total reflection mirror 40, and then returns to optical amplifier 31 via beam splitter 34 as a reflected beam.

The beam which was incident on optical amplifier 31 satisfies the phase-matching condition. Therefore, when this beam passes through optical amplifier 31, stimulated emission occurs and thus the beam is amplified. Accordingly, a beam having high intensity and a narrow spectral line width is output from the opposite end face of the amplifier.

The outgoing beam, which was optically amplified, is transformed into a collimated beam by lens 41 and is then transmitted through optical isolator 42. This beam is then converged by lens 43 and is incident on output fiber 44 as an output beam.

Here, the selected wavelength (i.e., the Bragg's wavelength) is changed by rotating diffraction grating 35 by using angle adjustment mechanism 36; hence the wavelength can be changed within the gain range of optical amplifier 31. In addition, it is possible to change the resonance wavelength by performing the parallel motion in the optical-axis direction of the resonator by using parallel motion mechanism 38. Accordingly, it is possible to simultaneously perform continuous wavelength tuning without mode hopping by controlling the change of the Bragg's wavelength by adjusting the angle of diffraction grating 35 and the change of the resonance wavelength by the positioning adjustment.

In the wavelength-tunable light source having the above-explained structure, semiconductor optical amplifying element 311 as an optical amplifier is not inserted within the resonator of optical resonance reflector B. Therefore, it is unnecessary to consider variation of the refractive index of semiconductor optical amplifying element 311.

Therefore, a beam having a stable wavelength can be obtained even though the driving current of semiconductor optical amplifying element 311 is changed. It is further possible to directly modulate light-intensity according to the driving current of semiconductor optical amplifying element 311. In this case, it is unnecessary to provide an additional optical modulator, or the like. It is also unnecessary to consider, in the case of wavelength tuning, a non-linear refractive-index variation with respect to the wavelength of semiconductor optical amplifying element 311, while the linear variation of the length of the resonator is required for the wavelength tuning. Accordingly, stable wavelength tuning can be realized.

In the first embodiment, the characteristics of beam splitter 34, which is used in optical resonance reflector B, were explained such that reflectance is 20% and transmittance is 80%. However, optical resonance reflector B having another characteristic of 10–40% of reflectance and thus 90–60% of transmittance may be used if a steep reflection characteristic with respect to the wavelength can be obtained.

Second Embodiment

Figure 2:
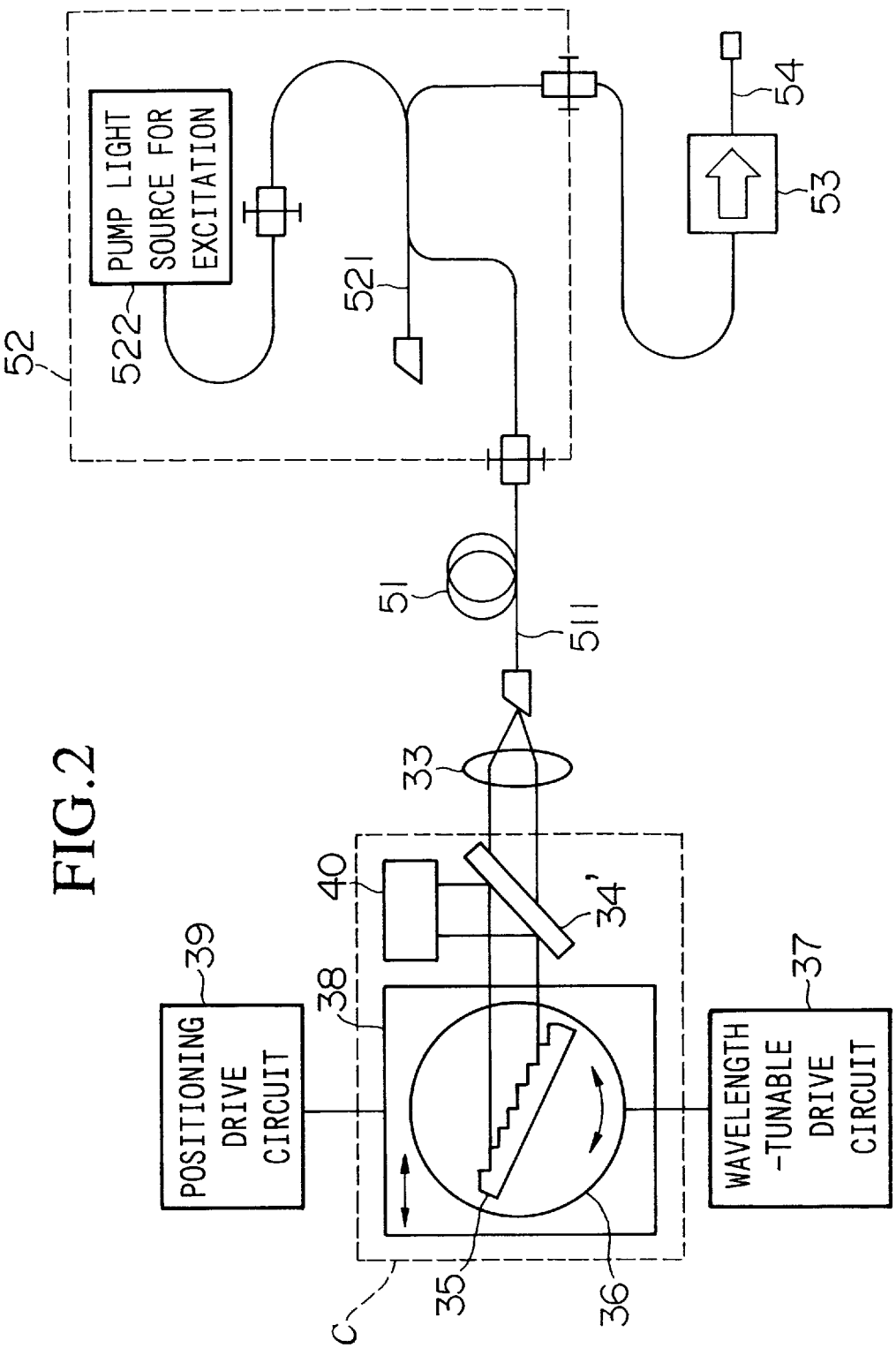
FIG. 2 is a block diagram showing the structure of the external resonator type wavelength-tunable light source of the second embodiment according to the present invention.

Hereinbelow, the structure of the external resonator type wavelength-tunable light source of the second embodiment according to the present invention will be explained with reference to FIG. 2. In FIG. 2, parts which are identical to those shown in FIG. 1 are given identical reference numbers, and duplicate explanations will be omitted here.

In FIG. 2, as for optical amplifier 51, optical-fiber type optical amplifier (or "fiber optical amplifying element") 511, to which a rare earth element is added, is used, and the output end face thereof of the optical resonance reflector C side is processed by antireflection coating. A natural emission beam output from this end face is transformed into a collimated beam by lens 33, and is introduced to optical resonance reflector C. On the other hand, a natural emission beam output from the other end face is introduced to output fiber 54, via fiber coupler 521 in optical amplifier drive circuit 52 and optical isolator 53 used for antireflection.

The optical amplifier drive circuit 52 comprises pump light source 522 for external excitation. The fiber optical amplifying element 511 is excited by inputting an excited beam generated by the pump light source 522 via fiber coupler 521 into an end face of fiber optical amplifying element 511.

That is, in the wavelength-tunable light source having the above-explained structure, population inversion occurs inside the fiber optical amplifying element 511 by inputting the excited beam generated by pump light source 522 (for excitation) in optical amplifier drive circuit 52 into fiber optical amplifying element 511, whereby a natural emission beam is generated from fiber optical amplifying element 511, as is in the case of a semiconductor optical amplifying element. When a beam input from the outside into this fiber optical amplifying element 511 passes through the element, stimulated emission occurs inside the element and an optically amplified beam is output from the output end thereof.

Therefore, the beam generated by pump light source 522 for excitation is made to pass through fiber optical amplifying element 511, and a natural emission beam generated by the fiber optical amplifying element 511 is incident on optical resonance reflector C. In this operation, only a wavelength selected by diffraction grating 35 leads to resonance, and thus only the beam having the resonance wavelength is again reflected to the optical amplifier 51 side. This beam input into the optical amplifier is then amplified and output. On the other hand, the beam from pump light source 522 for excitation is not selected by diffraction grating 35; therefore, this beam never returns to optical amplifier 51 and is thus never output from output fiber 54.

The structure of optical resonance reflector C as shown in FIG. 2 is different from the structure shown in FIG. 1 in which beam splitter 34 having 20% of reflectance and thus 80% of transmittance is used, and in FIG. 2, beam splitter 34' having 80% of reflectance and thus 20% of transmittance is used.

The natural emission beam from optical amplifier 51, which was transformed into a collimated beam by lens 33, is incident on beam splitter 34'. The beam splitter 34' has a characteristic of 80% of reflectance and 20% of transmittance, and thus makes 20% of the input collimated beam to the diffraction grating 35 as a wavelength-selection reflector. Therefore, the reflected beam of the Bragg's wavelength selected from among the natural emission beam (portions), which was input into diffraction grating 35, is again incident on beam splitter 34'. The 20% of the beam re-input into beam splitter 34' is transmitted to the optical amplifier 51 side, while the remaining 80% of the beam is reflected by the beam splitter 34' and is incident on total reflection mirror 40. The total reflection mirror 40 totally reflects the incident beam and makes the beam incident on beam splitter 34' again.

Then, by repeating the reflection and transmission between diffraction grating 35, beam splitter 34', and total reflection mirror 40, only a beam having the wavelength selected by diffraction grating 35, which also agrees with the resonance wavelength, resonates between the diffraction grating 35 and the total reflection mirror 40. This resonance beam returns from beam splitter 34' to optical amplifier 51 as a reflected beam of optical resonance reflector C.

Consequently, as the structure of optical resonance reflector B shown in the first embodiment, a beam satisfying the phase-matching condition can be obtained, and by the transmission through fiber optical amplifying element 511 as an optical amplifier, a beam having high light-intensity with a narrow spectral line width can be obtained.

In the second embodiment, the characteristics of beam splitter 34', which is used in optical resonance reflector C, were explained such that reflectance is 80% and transmittance is 20%. However, optical resonance reflector C having another characteristic of 90–60% of reflectance and thus 10–40% of transmittance may be used if a steep reflection characteristic with respect to the wavelength can be obtained.

In the above-explained first and second embodiments, the method for varying the wavelength is such that angle adjustment mechanism 36 for adjusting the angle of diffraction grating 35 and parallel motion mechanism 38 for adjusting the length of the resonator are individually controlled. However, a sine bar mechanism, which was explained in the description of the related art, may be used.

Additionally, in the above-explained first and second embodiments, the parallel motion of the diffraction grating 35 side is performed so as to adjust the length of the resonator. However, another arrangement may be adopted, in which a parallel motion mechanism is provided in the total reflection mirror 40 side, and the adjustment of the length of the resonator is performed by the parallel motion of the total reflection mirror 40. In this case, diffraction grating 35 functions only to rotate in accordance with angle adjustment using the angle adjustment mechanism, and thus the system configuration is simpler.

Third Embodiment

Figure 3:
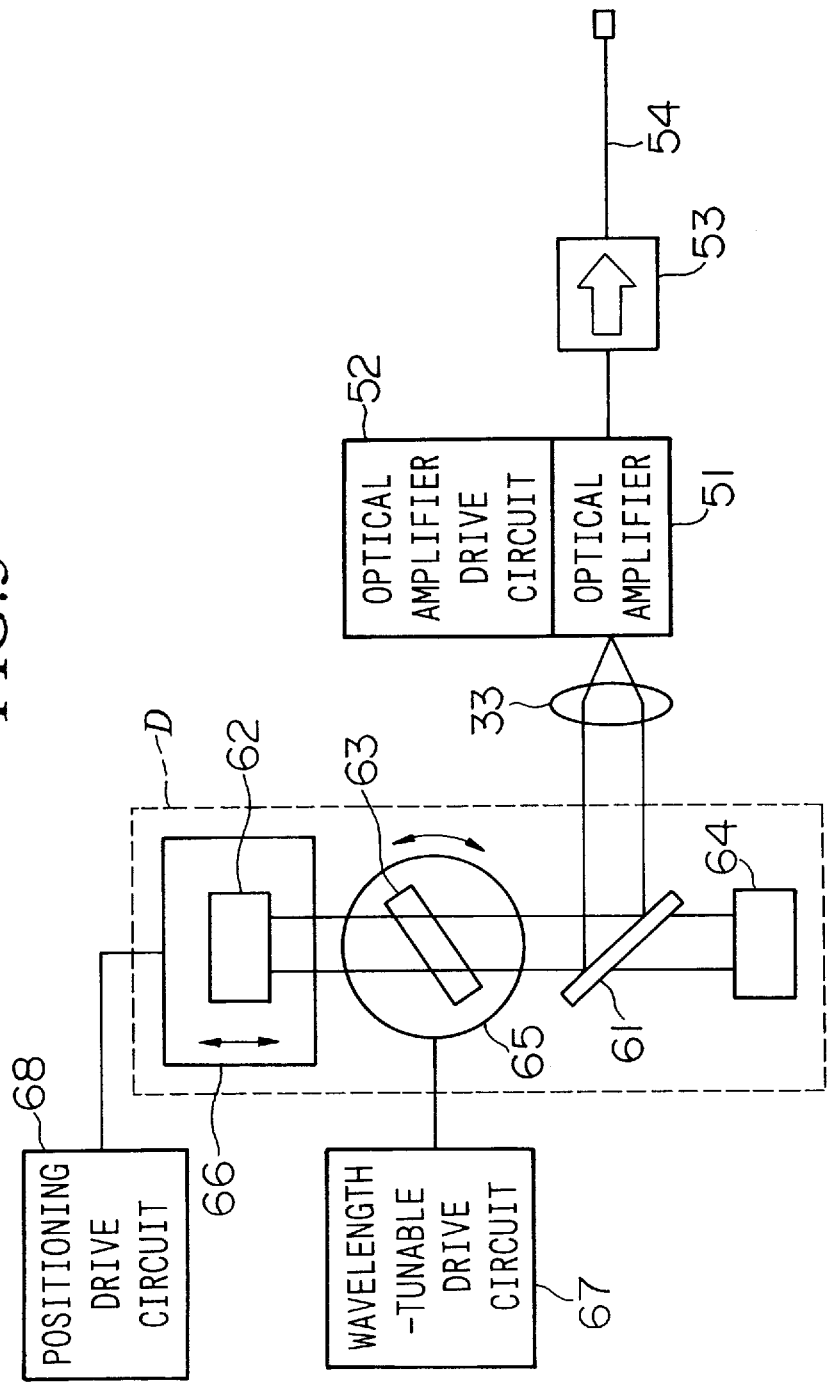
FIG. 3 is a block diagram showing the structure of the external resonator type wavelength-tunable light source of the third embodiment according to the present invention.

Hereinbelow, the structure of the external resonator type wavelength-tunable light source of the third embodiment according to the present invention will be explained with reference to FIG. 3. In FIG. 3, parts which are identical to those shown in FIGS. 1 and 2 are given identical reference numbers, and duplicate explanations will be omitted here.

In FIG. 3, a natural emission beam output from one end face of optical amplifier 51 (optical amplifier 31 in FIG. 1 may also be used) is incident on optical resonance reflector D via lens 33. This optical resonance reflector D consists of beam splitter 61, total reflection mirror 62, optical bandpass filter 63, total reflection mirror 64, angle adjustment mechanism 65, and parallel motion mechanism 66.

Here, beam splitter 61 reflects a collimated beam from lens 33 so as to introduce this beam to the first total reflection mirror via optical bandpass filter 63. The beam splitter also transmits one portion of the beam reflected by the total reflection mirror 62 so as to introduce the beam to total reflection mirror 64, and reflects the other portion (that is, the remaining portion) of the beam to optical amplifier 51 (or optical amplifier 31). Each of the total reflection mirror 62 and 64 totally reflects the incident beam in parallel with the optical axis of the incident beam, and thus these mirrors have a function of resonating a beam having a specific wavelength therebetween.

On the other hand, angle adjustment mechanism 65 can be controlled by wavelength-tunable drive circuit 67 so that the angle of the optical bandpass filter 63 with respect to the incident optical axis is adjustable. In addition, parallel motion mechanism 66 can be controlled by positioning drive circuit 68 so that the first total reflection mirror 62 can be shifted in parallel with the optical axis of the incident beam. The optical bandpass filter 63 is a filter using an interference film, and has s characteristic in which the transmission peak-wavelength changes according to the incident angle of a beam.

That is, in the wavelength-tunable light source having the above-explained structure, optical resonance reflector D is constructed by using a wavelength-selection reflector consisting of optical bandpass filter 63 using an interference film and total reflection mirrors 62 and 64, instead of adopting a structure using a diffraction grating. Also in the case of using optical bandpass filter 63, the transmission peak-wavelength is changed when the incident angle of a collimated beam is inclined from the vertical direction (that is, when having a certain angle with respect to the vertical direction). Therefore, the wavelength variation can be performed by adjusting the angle of optical bandpass filter 63 by using angle adjustment mechanism 65, as in the case of using a diffraction grating. In addition, the resonance wavelength can also be varied by moving (in parallel) one of total reflection mirrors 62 and 64 (in FIG. 3, total reflection mirror 62 is moved).

Figure 4:
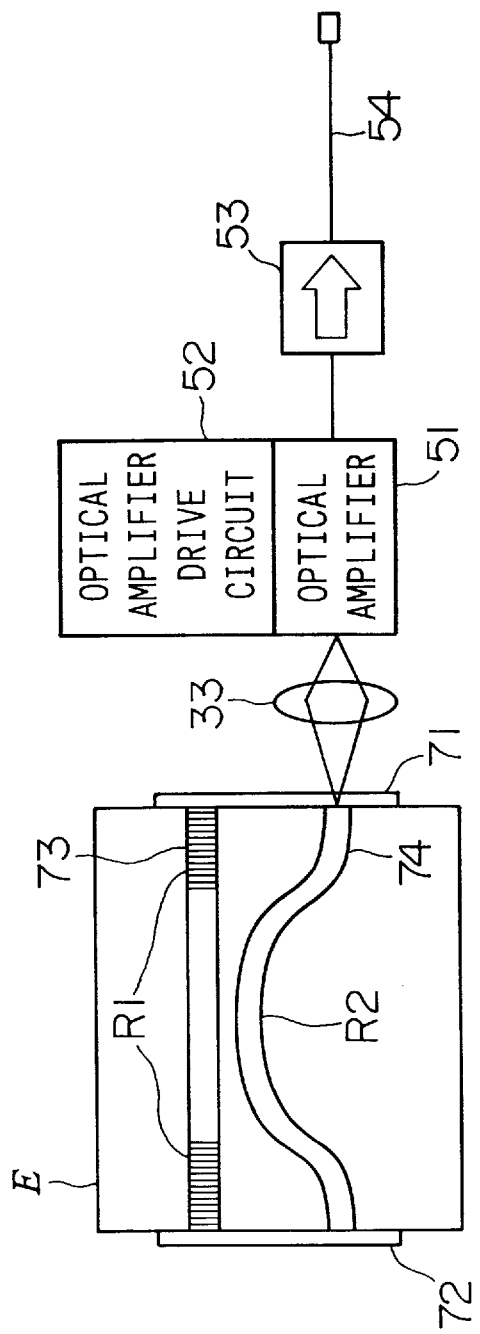
FIG. 4 is a block diagram of an application example according to the present invention, showing the structure of a light source using an optical resonance reflector of the optical waveguide type.
Figure 5:
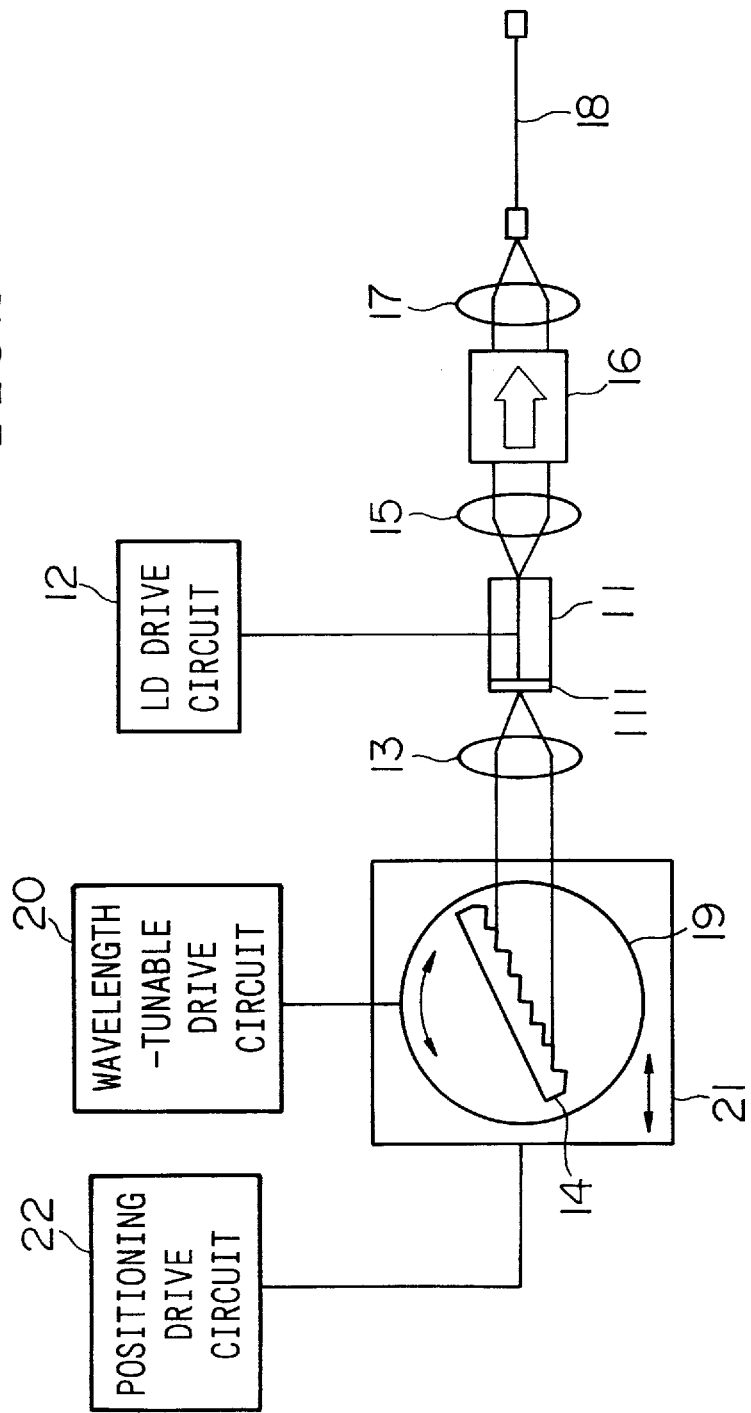
FIG. 5 is a block diagram showing a structure of the conventional external resonator type wavelength-tunable LD light source using a diffraction grating.
Figure 6:
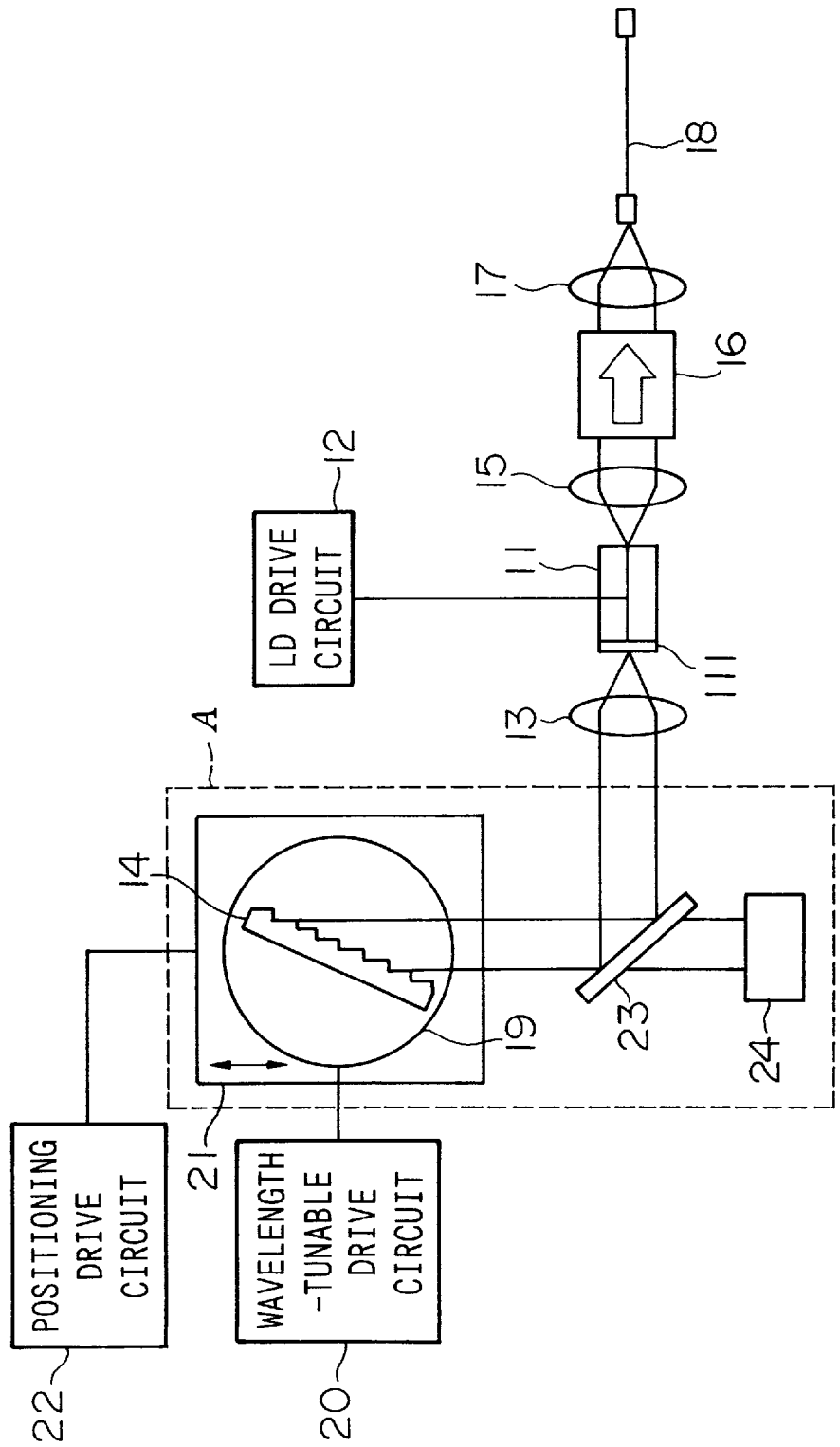
FIG. 6 is a block diagram showing a structure of the conventional external resonator type wavelength-tunable LD light source using an optical resonance reflector.
Figure 7:
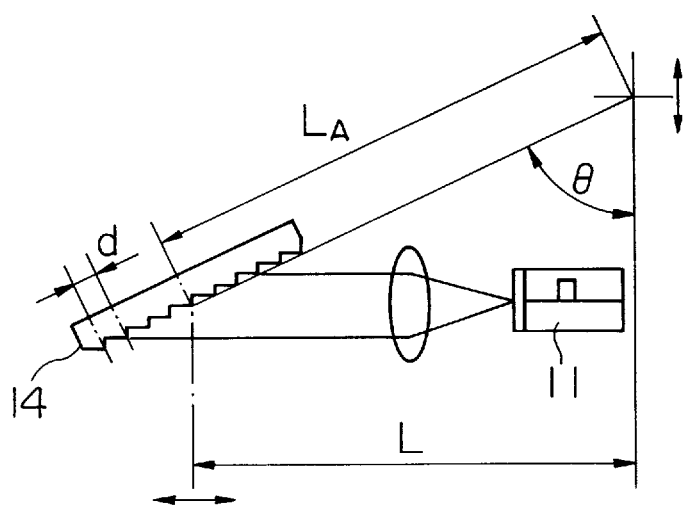
FIG. 7 is a diagram showing a structure of the conventional sine bar mechanism, a kind of conventional wavelength-varying mechanism.

Additionally, if the wavelength tuning is unnecessary, optical resonance reflector E which can be basically constructed by using optical waveguides, as shown in FIG. 4, may be used. In FIG. 4, parts which are identical to those shown in FIGS. 1–3 are given identical reference numbers, and explanations thereof will be omitted.

In this case, input and output end faces of optical waveguides 73 and 74 in the optical resonance reflector E are processed with antireflection coatings by providing AR coatings 71 and 72. As a wavelength-selection reflector, optical waveguide 73 having a DBR (distributed Bragg reflector) region indicated by reference symbol R1 and optical waveguide 74 on which a beam from optical amplifier 51 (optical amplifier 31 in FIG. 1 may also be used) is incident are coupled via an optical directional coupling region indicated by reference symbol R2. As a coupling characteristic of the optical directional coupling region with respect to the light shift from one optical waveguide to the other optical waveguide, 10–40% of the coupling rate is preferable.

What is claimed is:

1. An external resonator type wavelength-tunable light source comprising:
    an optical amplifier, both end faces thereof being antireflection-processed, for generating a natural emission beam from one end face of the amplifier, and for amplifying a beam input into the one end face and outputting the amplified beam from the other end face of the amplifier;
    an optical amplifier drive circuit for driving the optical amplifier;
    an optical resonance reflector for resonating the natural emission beam output from the optical amplifier at an optical resonance wavelength, and reflecting the resonated beam to the one end face of the optical amplifier;
    wavelength control means for controlling the optical resonance wavelength of the optical resonance reflector;
    resonance length control means for controlling a resonance length of the optical resonance reflector; and
    beam output means for extracting a beam, which was reflected by the optical resonance reflector; amplified by the optical amplifier; and output from the other end face of the optical amplifier, and outputting the extracted beam.

2. An external resonator type wavelength-tunable light source as claimed in claim 1, wherein the optical resonance reflector comprises:
    a diffraction grating for reflecting a beam in parallel with the optical axis of an incident beam on the diffraction grating, the wavelength of the reflected beam being different in accordance with the incident angle of the incident beam;
    a total reflection mirror for reflecting an incident beam on the mirror in parallel with the optical axis of the incident beam; and
    a beam splitter for reflecting the natural emission beam from the optical amplifier to the diffraction grating; transmitting and introducing one portion of a beam reflected by the diffraction grating to the total reflection mirror so as to make the beam resonate between the diffraction grating and the total reflection mirror, and simultaneously reflecting the remaining portion of the beam reflected by the diffraction grating to the optical amplifier.

3. An external resonator type wavelength-tunable light source as claimed in claim 2, wherein:
    the wavelength control means adjusts the angle of the diffraction grating with respect to the optical axis of the incident beam on the diffraction grating; and
    the resonance length control means makes at least one of the diffraction grating and the total reflection mirror move along and in parallel with the resonance optical axis.

4. An external resonator type wavelength-tunable light source as claimed in claim 1, wherein the optical resonance reflector comprises:
    a diffraction grating for reflecting a beam in parallel with the optical axis of an incident beam on the diffraction grating, the wavelength of the reflected beam differing in accordance with the incident angle of the incident beam;
    a total reflection mirror for reflecting an incident beam on the mirror in parallel with the optical axis of the incident beam; and
    a beam splitter for transmitting and introducing the natural emission beam from the optical amplifier to the diffraction grating; reflecting and introducing one portion of a beam reflected by the diffraction grating to the total reflection mirror so as to make the beam resonate between the diffraction grating and the total reflection mirror, and simultaneously transmitting the remaining portion of the beam reflected by the diffraction grating to the optical amplifier.

5. An external resonator type wavelength-tunable light source as claimed in claim 3, wherein:
    the wavelength control means adjusts the angle of the diffraction grating with respect to the optical axis of the incident beam on the diffraction grating; and
    the resonance length control means makes at least one of the diffraction grating and the total reflection mirror move along and in parallel with the resonance optical axis.

6. An external resonator type wavelength-tunable light source as claimed in claim 1, wherein the optical amplifier is a semiconductor optical amplifying element, both end faces of the element being antireflection-processed.

7. An external resonator type wavelength-tunable light source as claimed in claim 1, wherein:
    the optical amplifier is a fiber optical amplifying element; and
    the optical amplifier drive circuit comprises a pump light source for excitation and a fiber coupler, and
    wherein an excited beam generated by the pump light source for excitation is incident on one end face of the fiber optical amplifying element via the fiber coupler, and an outgoing beam from the one end face of the fiber optical amplifying element is output via the fiber coupler.

8. An external resonator type wavelength-tunable light source as claimed in claim 1, wherein the optical resonance reflector comprises:

first and second total reflection mirrors, facing each other, for reflecting an incident beam in parallel with the incident optical axis, respectively;

a beam splitter for reflecting and introducing the natural emission beam from the optical amplifier to the first total reflection mirror; transmitting and introducing one portion of a beam reflected by the first total reflection mirror to the second total reflection mirror so as to make the beam resonate between the first and second total reflection mirrors, and simultaneously reflecting the remaining portion of the beam reflected by the first total reflection mirror to the optical amplifier; and an optical bandpass filter, inserted into an optical path between one of the first and second total reflection mirrors and the beam splitter, for transmitting a beam of a wavelength which is different in accordance with the angle of the filter with respect to the axis of the optical path.

9. An external resonator type wavelength-tunable light source as claimed in claim 8, wherein:

the wavelength control means adjusts the angle of the optical bandpass filter with respect to the optical axis of the incident beam on the filter; and the resonance length control means makes at least one of the total reflection mirrors move along and in parallel with the resonance optical axis.

* * * * *